(12) United States Patent
Grann

(10) Patent No.: US 6,396,978 B1
(45) Date of Patent: May 28, 2002

(54) OPTICAL WAVELENGTH DIVISION MULTIPLEXER/DEMULTIPLEXER HAVING PATTERNED OPAQUE REGIONS TO REDUCE OPTICAL NOISE

(75) Inventor: Eric B. Grann, San Ramon, CA (US)

(73) Assignee: Blaze Network Products, Inc., Dublin, CA (US)

( * ) Notice: Subject to any disclaimer, the term of this patent is extended or adjusted under 35 U.S.C. 154(b) by 9 days.

(21) Appl. No.: 09/693,439

(22) Filed: Oct. 20, 2000

Related U.S. Application Data

(63) Continuation-in-part of application No. 09/347,490, filed on Jul. 2, 1999.

(51) Int. Cl.[7] ................................................. G02B 6/36
(52) U.S. Cl. ............................................. 385/24; 385/74
(58) Field of Search .............................. 385/24, 47, 76; 356/318

(56) References Cited

U.S. PATENT DOCUMENTS

| 5,894,535 A | * | 4/1999 | Lemoff et al. ................. 385/47 |
| 6,081,330 A | * | 6/2000 | Nelson et al. ............... 356/318 |
| 6,118,912 A | * | 9/2000 | Xu ................................ 385/24 |
| 6,122,417 A | * | 9/2000 | Jayaraman et al. ............ 385/24 |
| 6,201,908 B1 | * | 3/2001 | Grann .......................... 385/24 |
| 2001/0026663 A1 | * | 10/2001 | Kim et al. ..................... 385/76 |

* cited by examiner

Primary Examiner—Ricky Mack
Assistant Examiner—Omar Hindi
(74) Attorney, Agent, or Firm—Bruce H. Johnsonbaugh

(57) ABSTRACT

A patterned opaque layer is applied between adjacent filters mounted on a common optical block surface in a wavelength division multiplexer and demultiplexer. The patterned opaque layer covers the optically transparent regions between adjacent filters mounted on the common surface of the optical block. The patterned opaque layer is also applied around the perimeter of the footprint of the array of filters mounted on the common surface of the optical block. The patterned opaque layer reduces cross-talk between the filters and reduces optical noise.

5 Claims, 5 Drawing Sheets

OPTICAL WAVELENGTH DIVISION MULTIPLEXER/DEMULTIPLEXER HAVING PATTERNED OPAQUE REGIONS TO REDUCE OPTICAL NOISE

CROSS-REFERENCE TO RELATED APPLICATION

This is a continuation-in-part of U.S. application Ser. No. 09/347,490 filed Jul. 2, 1999.

BACKGROUND AND BRIEF SUMMARY OF THE INVENTION

The present invention relates generally to optical multiplexers/demultiplexers. More specifically, the present invention relates to zigzag pathway optical multiplexers/demultiplexers with discrete optical filters wherein adjacent filters on a common surface (typically a flat surface of a molded optical block) have an optically transparent region between filters. The present invention recognizes that said optically transparent regions create optical noise; that noise is reduced by applying a patterned opaque layer between filters.

The present invention is particularly effective in reducing optical noise in the multiplexer/demultiplexer design shown and described in U.S. application Ser. No. 09/347,490, which is incorporated by reference herein as though set forth in full. The present invention is also applicable to other optical multiplexer/demultiplexer designs which utilize two or more discrete filters on a common surface having an optically transparent region between those discrete filters.

Prior art optical multiplexers and demultiplexers include the Nosu et al U.S. Pat. No. 4,244,045. Nosu utilizes a series of wavelength sensitive filters arranged in a zigzag optical pathway at a predetermined oblique angle to the light beam. Nosu positions filters on both sides of substrate 60. It is significant that the fabrication of the Nosu device is expensive and time consuming. No suggestion is made in Nosu concerning reduction of optical noise or the use of an opaque layer between filters.

The Scobey U.S. Pat. Nos. 5,583,683 and 5,786,915 teach an eight channel multiplexing device in which a continuous variable thickness interference filter is deposited onto the surface of an optical block. This design has inherent weaknesses. First, each filter must necessarily integrate the signal over its width, since its thickness (and wavelength sensitivity) varies across its width; resulting in less precise filtering. Secondly, the interference filter thickness may vary from device to device, also degrading its filtering performance. Thirdly, each of the individual couplers such as item 62 of FIG. 3 must be separately aligned after fabrication. Fourth, no suggestion is made concerning the use of an opaque layer to reduce optical noise.

The Scobey et al U.S. Pat. No. 5,859,717 teaches the use of a precision optical block which is opaque (col. 4, lines 20–29) and in which slots or gaps are machined or formed to provide an optical path, resulting in an inherently very expensive product. Furthermore, the separate collimators (6,24,46) and filters 32 must be separately aligned after fabrication of the device, adding to the time and expense of production. The present invention utilizes a patterned opaque region applied to a molded optical block, which is much cheaper than machining an opaque material. The present invention avoids the separate alignment of filters required by Scobey'717.

The Jayaraman U.S. Pat. No. 5,835,517 teaches an optical multiplexer having multiple optical cavities which must each be "tuned" after fabrication by adjusting its length. No suggestion is made of using an opaque pattern to reduce optical noise.

The Lemoff et al U.S. Pat. No. 5,894,535 teaches an optical multiplexer in which a plurality of dielectric channel waveguides are embedded in a cladding region, which process is considerably more expensive than the monolithic formed optical blocks used in the present invention. Furthermore, the filters must be separately aligned with the channel waveguides after fabrication. No suggestion is made of using opaque regions between filters to reduce optical noise.

An optical multiplexing device combines or separates multiple light signals with varying optical frequencies. The optical multiplexing device has applications for both dense and coarse wavelength division multiplexing (DWDM and CWDM) for both multi-mode and signal-mode fiber optic data communications and telecommunications. Multiple wavelength light sources are combined into a single optical path for transmission or multi-wavelength light travelling in a single optical path is separated into multiple narrow spectral bands that is focused onto individual fiber optic carriers or detectors.

Current wavelength division multiplexed (WDM) devices are designed for operation in single-mode optical fiber telecommunications systems, where performance over long distances (>100 km) is the primary factor and cost and size are secondary. As bandwidth demands within the Networking Industry [Local Area Networks (LAN) and Wide Area Networks (WAN)] increase, compact inexpensive wavelength division multiplexed systems will become necessary in order to utilize the full bandwidth of the optical fiber. The WDM device described herein utilizes plastic-mold injection and inexpensive dielectric filters to create a compact device capable of multiplexing or demultiplexing multiple optical wavelengths.

A primary object of the invention is to provide a patterned opaque layer between adjacent, discrete filters in an optical multiplexer/demultiplexer in order to reduce optical noise.

Another object of the present invention is to provide a compact and cost effective optical multiplexer and demultiplexer using inexpensive, discrete filters mounted on molded, optical blocks for both single-mode or multi-mode fiber optic communication systems wherein cross-talk between adjacent filters is reduced.

A further object of the invention is to provide an optical multiplexer/demultiplexer having preformed parts with premolded, passively aligned optics and a series of discrete filters and reduced cross-talk between filters.

Other objects and advantages of the invention will become apparent from the following description and drawings wherein:

DETAILED DESCRIPTION OF THE DRAWINGS

Figure 1:
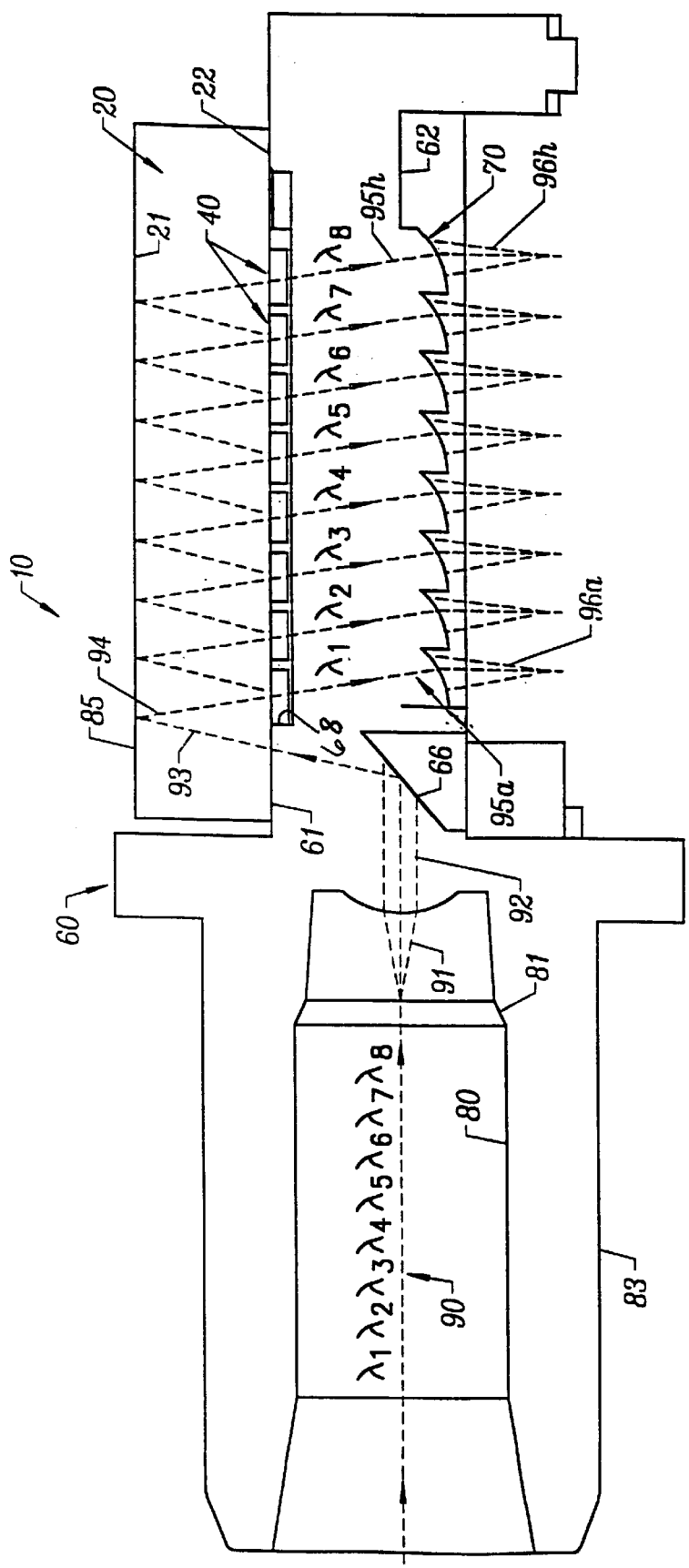
FIG. 1 shows a cross section side view of an entire WDM optical multiplexer/demultiplexer using the present invention.
Figure 2:
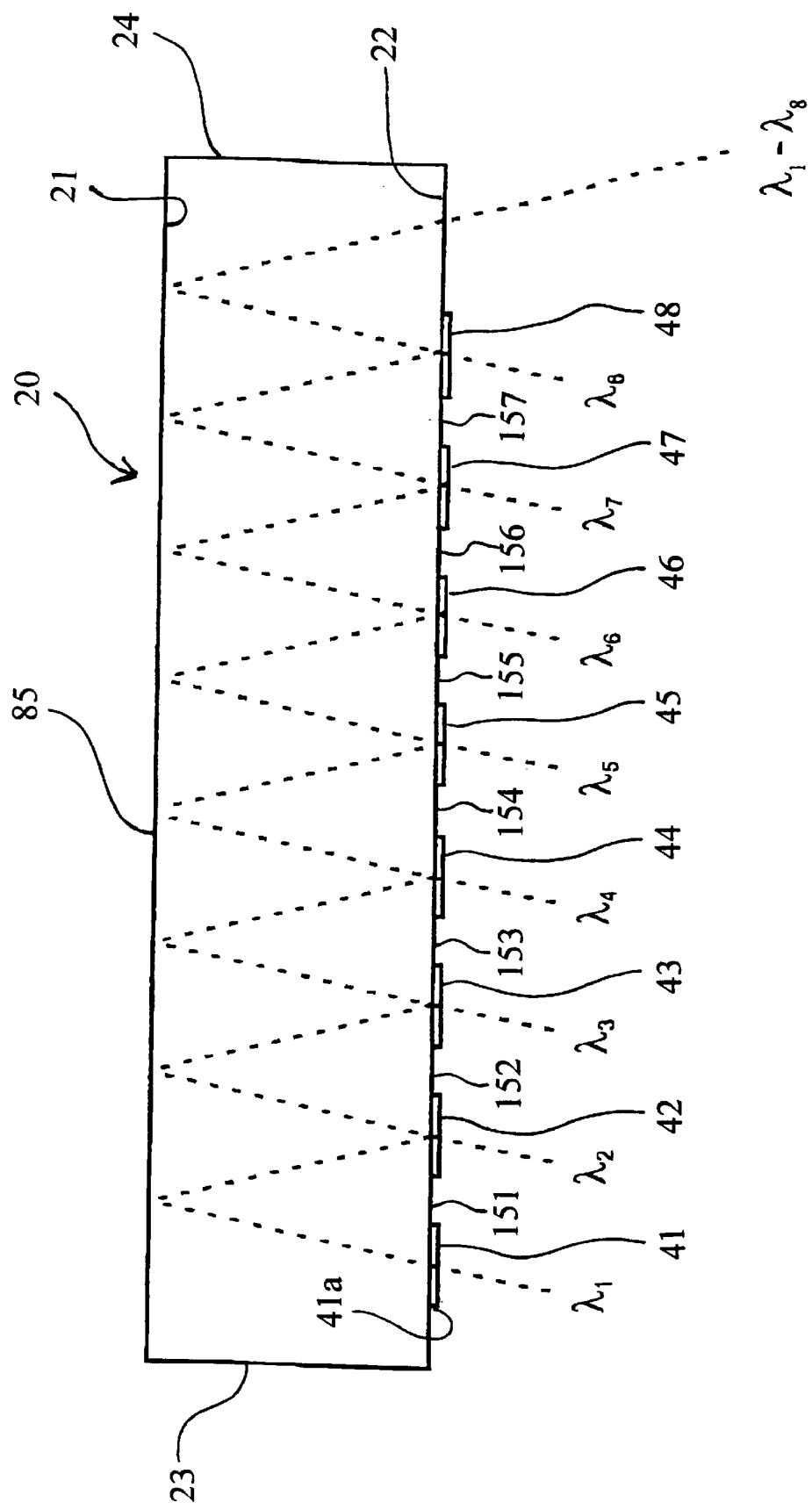
FIG. 2 shows a cross-sectional side view of the optical block of FIG. 1, without the patterned opaque layer for clarity.
Figure 3:
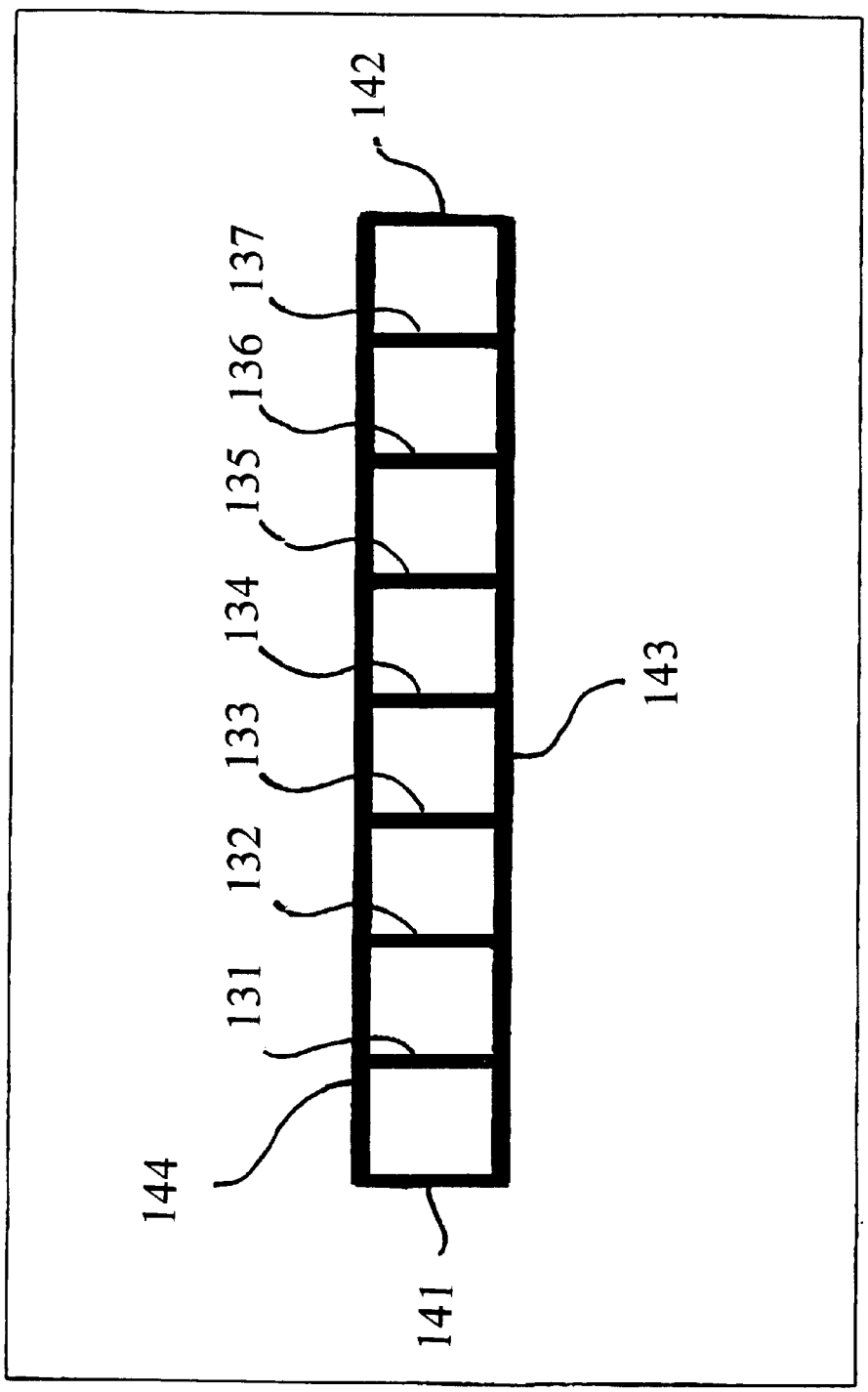
FIG. 3 shows a bottom view of the optical block of FIG. 2, and showing the patterned opaque layer of the present invention.
Figure 4:
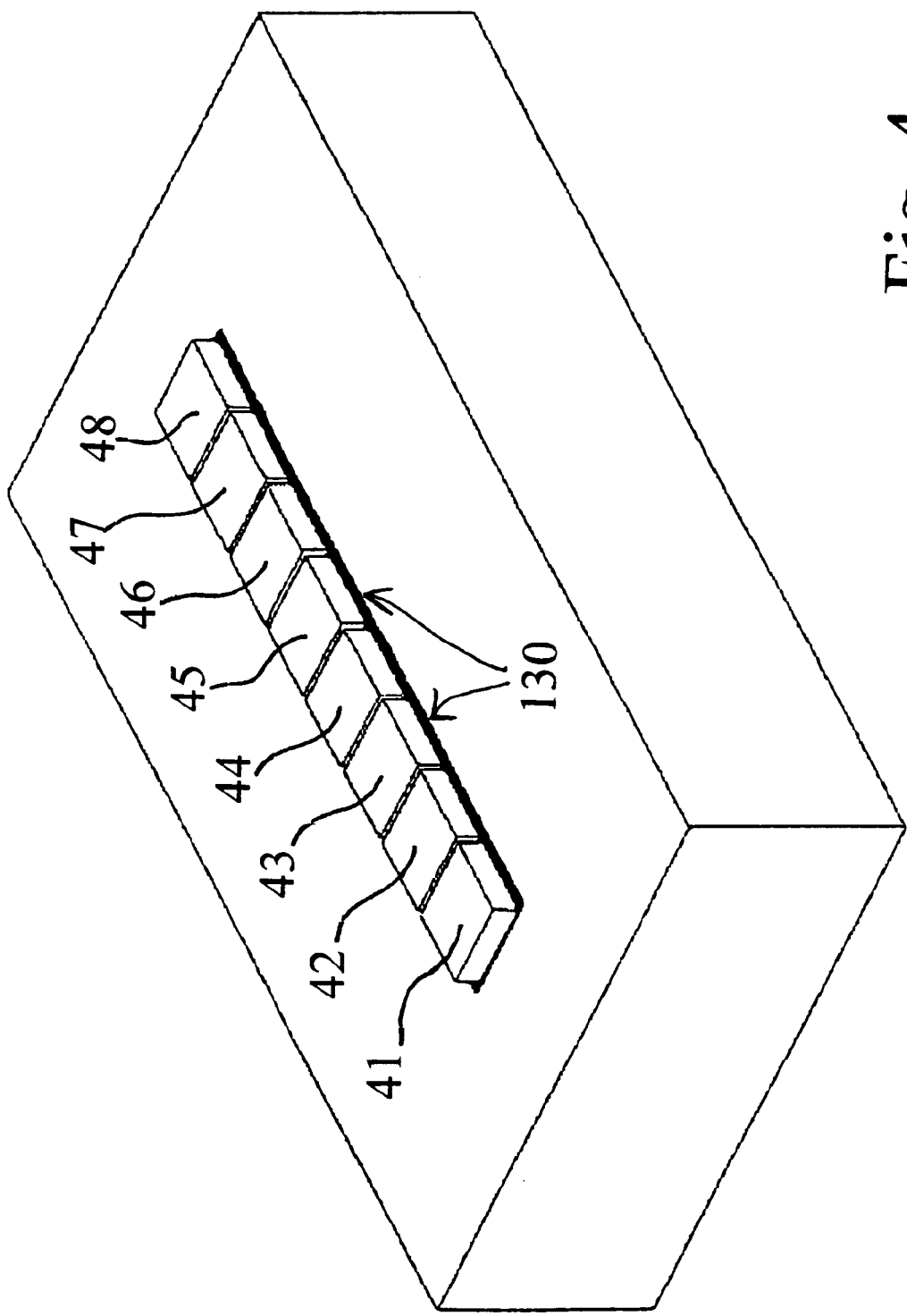
FIG. 4 shows an isometric bottom view of the optical block of FIGS. 1–3 showing the discrete filters positioned on the patterned opaque layer of the present invention.
Figure 5:
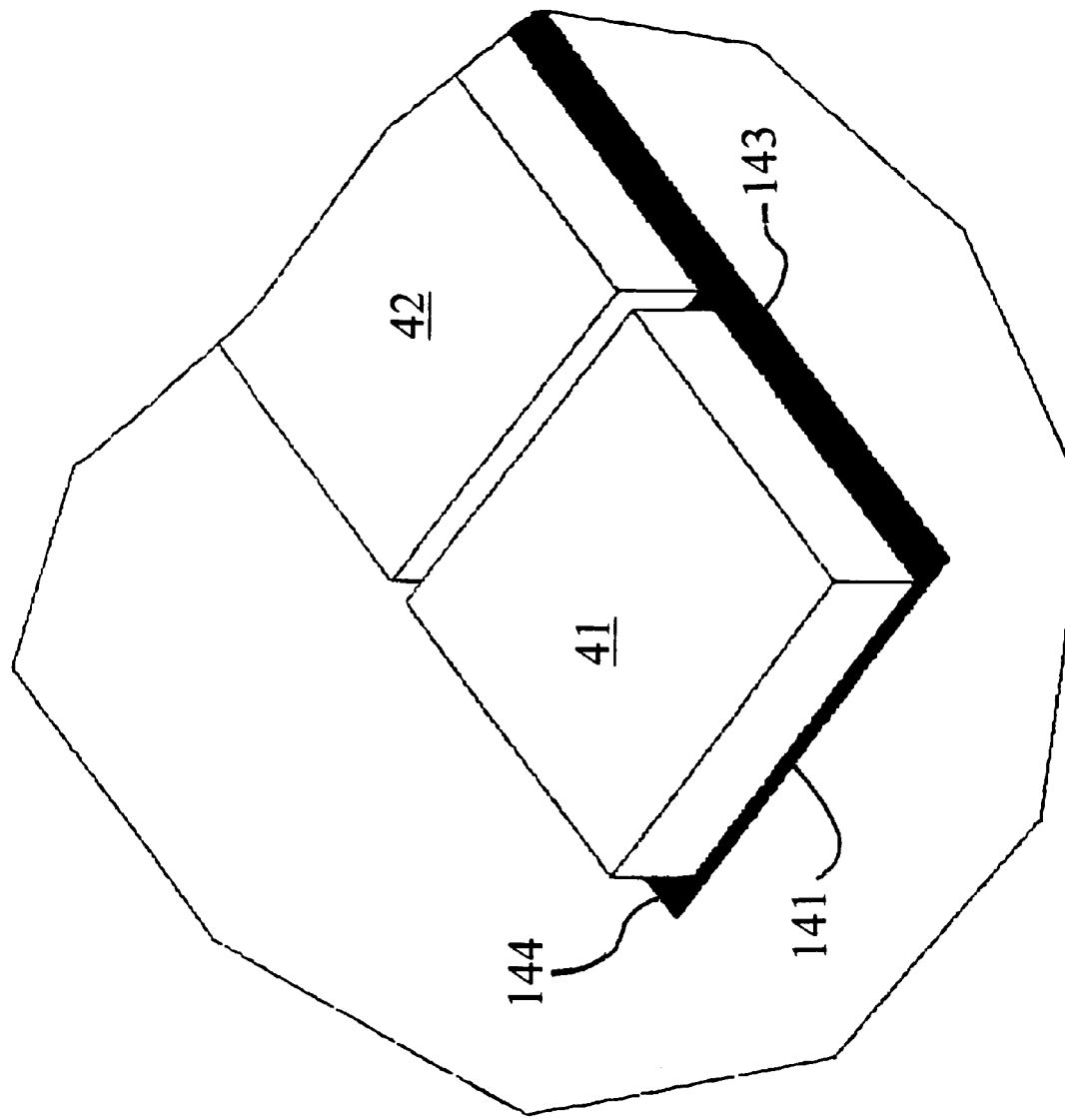
FIG. 5 shows an isometric bottom view of a portion of FIG. 4.

FIG. 1 shows the assembled wavelength division multiplexer/demultiplexer 10 which utilizes the present invention. FIG. 2 shows the optical block without the patterned opaque layer for clarity and FIGS. 3–5 show the patterned opaque layer 130 of the present invention. A complete description of the device shown in FIG. 1 is contained in application Ser. No. 09/347,490. A portion of that description is repeated here for convenience. The device shown in FIG. 1 has the ability to combine individual light signals into a single optical path which can be directed towards an optical fiber, and/or demultiplex such signals into individual channels. For simplicity of explanation, the demultiplexing functionality is described, since those skilled in the art will readily understand the correlative multiplexing functionality.

FIG. 1 shows the assembled primary components and illustrates the optical pathway 90–96 wherein an incoming signal includes eight separate wavelengths (n wavelengths in the general case), which are separated into eight separate channels to be read by photodetectors (not shown). An optical block 20 may either be formed of glass or molded of plastic is shown with a plurality of filters 40 carried on its lower surface 22. The optical block 20 has an upper flat surface 21 which is coated with a reflective material 85.

A molded coupling module 60 has a flat upper surface 61 which is adhesively connected to the flat lower surface 22 of optical block 20.

The molded coupling module 60 in the embodiment illustrated in FIG. 1 includes a fiber optic cable receptacle 80 integrally molded therein for receiving the end of a fiber optic cable (not shown) so that the end of the cable engages receptacle seat 81.

As illustrated in FIG. 1, a multiplexed optical beam moves along optical pathway 90, exits the end of the fiber optic cable (not shown) and begins to diverge as shown at 91. An integrally molded collimating lens 65 collimates the diverging light beam 91 and forms a collimated beam 92. The collimated light beam 92 is reflected off integrally formed reflective surface 66 of the molded coupling module 60 and is directed upwardly toward the reflective coating 85 carried by the flat upper surface 21 of the optical block 20. As the light beam moves through that section 93 of the optical pathway, it impinges against the reflective coating 85 at a predetermined angle of incidence as known in the art. The reflected beam 94 is reflected in a zigzag pattern in optical block 20 between the plurality of n filters 40 and the reflective surface 85 as is known in the art. As the reflected beam enters each of the n filters, one of the n different wavelengths of light is transmitted through each filter and the separated wavelengths move along the optical pathways 95a through 95h toward the plurality of molded aspheric surfaces 70 formed on the lower surface 62 of the molded coupling module 60. Each of the n aspheric molded surfaces focuses the separated wavelength bands or channels 96a–96h onto separate photodetectors (not shown), as known in the art.

As shown in FIG. 2, the optical block 20 is generally rectangular in shape having flat upper and lower surfaces 21 and 22, a flat proximal end wall 23 and a flat distal wall 24. The optical block in the preferred embodiment of the invention is formed from a high quality optical glass. Alternately, the optical block 20 may be injection molded using high quality optical plastic. The reflective coating 85 is applied to the upper surface 21 of block 20. The reflective coating may be formed of materials conventionally used in this art, such as dielectric interference coatings or metallic coatings.

The present invention includes a first embodiment having a single precision optical block with a reflective coating on one side and an array of discrete multiwavelength Fabry-Perot transmission filters on the other side. The precision optical block 20 can be formed of any transparent optical material capable of transmitting light over the desired spectral region and being formed or polished to the correct thickness. The reflective surface 85 can be placed on the optical block by a number of techniques, to include; dielectric interference coatings, metallic coatings, etc.

The plurality of n filters 40 includes eight discrete Fabry-Perot filters 41–48 mounted adjacent each other on the flat bottom surface 22 of optical block 20, as shown best in FIG. 2. Each of the discrete filters 41–48 is spaced apart slightly from each other as they are adhesively connected to the bottom surface 22 of optical block 20. This method of placing the discrete Fabry-Perot filters adjacent each other on a known flat surface avoids many of the bonding and alignment problems in existing prior art wavelength division multiplexers. Additionally, the proximal end 41a of filter 41 is intended to contact the seat 68 (FIG. 1) of the molded coupling module 60 so that the filter assembly will have the proper optical alignment with the aspheric lens array when the device has been assembled. The small spaces 151–157 between adjacent filters are optically transparent, and that transparency contributes optical noise to the operation of the device.

The assembly of the filter array onto the optical block and then the adhesive bonding of the optical block 20 to the molded coupling module 60 achieves a passive optical alignment of the critical optical elements of the device. When assembled as described above, the output beam 91 of the fiber optic cable is directly coupled to the wavelength division multiplexer/demultiplexer 10 and is automatically and passively aligned with the internal optics of the device, including the collimating lens 65, the beam reflection means, the reflective coating 85 on the top surface of optical block 20 as well as with the plurality of filters 40 and the plurality of aspheric surfaces 70. No postfabrication alignment or tuning or adjustment of these optical elements is required.

As shown best in FIGS. 3–5, a patterned opaque layer 130 is formed on the lower surface 22 of optical block 20. The opaque layer 130 covers the spaces 151–157 between adjacent filters and also covers the perimeter of the filter array. The patterned opaque layer 130 includes transverse lines 131–137 with sufficient width slightly larger than the optically transparent regions or gaps between adjacent filters 41–48. The slightly larger width of opaque material is sufficiently wide to prevent any undesired light from penetrating through the gap between adjacent filters. The patterned opaque layer 130 also preferably includes perimeter lines 141–144 which extend around the perimeter of the footprint of the array of filters 41–48. The width of perimeter lines 141–144 is sufficient to reduce optical noise created by the filter edges interacting with portions of diverged light in the optical pathway.

The opaque layer 130 can be constructed of different materials (i.e. aluminum, dielectric coating, gold, etc.) and can be applied either through lithography or direct writing.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be, defined by the following claims.

What is claimed is:

1. In an optical wavelength division multiplexer or demultiplexer having a zig-zag optical pathway, and having a plurality of discrete filters wherein each filter transmits a selected wavelength and reflects other wavelengths, and wherein at least two of said discrete filters are positioned adjacent each other on a common surface with an optically transparent region between said two discrete filters, the improvement comprising:

a patterned opaque layer means carried on said common surface to reduce optical noise, said patterned opaque layer means covering said optically transparent region between said filters on said common surface.

2. The apparatus of claim 1 wherein said patterned optical layer means extends around the perimeter of said plurality of filters.

3. The apparatus of claim 1 wherein said plurality of discrete filters is carried on a common, flat surface of a molded optical block.

4. In an optical wavelength division multiplexer and demultiplexer for single-mode or multi-mode fiber optic communication systems, wherein n channels are transmitted through a single fiber optic cable having n different wavelengths and wherein the optical couplings, lenses and alignment of the device are achieved by forming and joining of prefabricated parts to avoid post-fabrication alignment and adjustment of the optical pathway otherwise required, including an optical block having a flat first surface and a flat second surface, a reflective coating carried by said first surface of said optical block, a plurality of filters carried on said second surface of said optical block, said filters adapted to separately filter two or more of said n different wavelengths, said second surface of said optical block having optically transparent regions between adjacent filters, the improvement comprising:

a patterned opaque layer means carried on said second surface of said optical block to reduce optical noise, said patterned opaque layer means covering said optically transparent region between said filters on said second surface.

5. The apparatus of claim 4 wherein said patterned optical layer means extends around the perimeter of said plurality of filters.

* * * * *